United States Patent [19]
Miyazaki

[11] Patent Number: 5,939,907
[45] Date of Patent: Aug. 17, 1999

[54] LOW POWER, HIGH SPEED DRIVING CIRCUIT FOR DRIVING SWITCHING ELEMENTS

[75] Inventor: Takahiro Miyazaki, Hiji-machi, Japan

[73] Assignee: Texas Instruments Incorporated, Dallas, Tex.

[21] Appl. No.: 08/241,875

[22] Filed: May 12, 1994

[30] Foreign Application Priority Data

May 12, 1993 [JP] Japan .................................. 5-110573

[51] Int. Cl.$^6$ ....................................................... H03B 1/00
[52] U.S. Cl. ............................................ 327/108; 327/309
[58] Field of Search ..................................... 307/270, 544, 307/562, 563, 570, 571, 572; 327/108, 109, 110, 111, 112, 309, 310, 323, 379, 427, 432

[56] References Cited

U.S. PATENT DOCUMENTS 5,053,643  10/1991  Tanaka et al. ........................... 307/443

*Primary Examiner*—Tim Callahan
*Assistant Examiner*—Jeffrey Zweizig
*Attorney, Agent, or Firm*—William B. Kempler; Richard L. Donaldson

[57] ABSTRACT

A driving circuit with low power consumption and high operational speed, and including transistors $Q_1$, $Q_2$, $Q_3$, $Q_4$, $P_1$ and $P_2$, resistors $R_1$ and $R_2$, and diodes $D_1$ and $D_2$ which form a high-level feeding circuit for setting the output terminal level at the high level; and a constant-current source $I_{BS}$, current mirror circuit $MR_{12}$, transistors $Q_{11}$, $Q_{13}$ and $Q_{14}$, resistor $R_{11}$, and Schottky diode $DS_{11}$ which form a low-level feeding circuit for setting the output terminal level at the low level. When the output terminal ($T_{out}$) level is changed to the high level or low level, a large current flows into the base of transistor $Q_3$ or $Q_{13}$, and a rapid change takes place for the output terminal level. When the output terminal level reaches the prescribed voltage, the current flowing into the base of transistor $Q_3$ or $Q_{13}$ disappears. Consequently, the power consumption is reduced in the steady state when the output terminal level is steady.

2 Claims, 4 Drawing Sheets

LOW POWER, HIGH SPEED DRIVING CIRCUIT FOR DRIVING SWITCHING ELEMENTS

This invention concerns a type of driving circuit for driving the switching elements of switching regulators, etc.

BACKGROUND OF THE INVENTION

Usually, the switching elements of switching regulators are made of n-channel MOS (metal oxide semiconductor) transistors (referred to as NMOS transistors hereinafter).

For this type of NMOS transistor, the driving signal can be provided as either a high level or low level signal to the gate of the NMOS transistor so that the NMOS transistor is turned on/off and acts as a switching element.

In consideration of the advantage that a large current can flow to the gate of the NMOS transistor, a circuit using a bipolar transistor is often used as the driving circuit for providing the driving signal.

FIG. 8 is a circuit diagram illustrating an example of a conventional driving circuit.

In FIG. 8, 1 represents a control circuit; $V_{cc}$ represents a power source voltage; $q_1$, $q_2$ represent npn transistors used as output transistors; D represents a clamping circuit made of a number of diodes; and NT represents an NMOS transistor used as a switching element. The driving circuit comprises control circuit 1, clamping circuit D, and transistors $q_1$ and $q_2$.

The base of transistor $q_1$ is connected to output terminal 1a of control circuit 1; the collector is connected to power source voltage $V_{cc}$; and the emitter is connected to the collector of transistor $q_2$.

The base of transistor $q_2$ is connected to output terminal 1b of control circuit 1, and its emitter is connected to ground.

The middle point of the connection between the emitter of transistor $q_1$ and the collector of transistor $q_2$ becomes output terminal $T_{out}$ of the circuit in FIG. 8, and it is connected to the gate of NMOS transistor NT.

A clamping circuit D made of a number of diodes connected in series is connected in the forward direction from the base of transistor $q_1$ and ground. The clamping circuit D is arranged to ensure high-speed operation of the driving circuit as it clamps the high-level output to prevent the high-level output at the output terminal $T_{out}$ from shooting above a prescribed potential.

In this configuration, when high-level output appears at output terminal $T_{out}$, current $i_1$ is sent from output terminal 1a of control circuit 1 to the base and clamping circuit D of transistor $q_1$; when a low level is output from output terminal $T_{out}$, current $i_2$ is fed from output terminal 1b to the base of transistor $q_2$.

As shown in FIG. 9, currents $i_1$ and $i_2$ output from control circuit 1 have an opposite phase relationship with respect to each other, and they are fed to transistors $q_1$, clamping circuit D and the base of transistor $q_2$.

As a result, transistors $q_1$ and $q_2$ are turned on/off in a complementary fashion with respect to each other. As shown in FIG. 9, rectangular-shaped output $V_{out}$ is obtained at output terminal $T_{out}$.

This output $V_{out}$ is fed to the gate of NMOS transistor NT, so that NMOS transistor NT is turned on/off.

However, in the aforementioned conventional circuit, as seen from point A on the output side as shown in FIG. 8, there is a high dc impedance at the gate of NMOS transistor NT. Consequently, emitter current $i_{1E}$ of transistor $q_1$ and collector current $i_{2C}$ of transistor $q_2$ can flow only in the transition state when the gate of the NMOS transistor is switched from the off state to the on state or from the on state to the off state, while they do not flow in the other steady state.

In the aforementioned conventional circuit, both in the transition state and in the steady state, current $i_1$ or $i_2$ is always fed from control circuit 1 to the base and clamping circuit D of transistor $q_1$ and the base of transistor $q_2$. Consequently, the power consumption is high. This is a disadvantage.

That is, in the conventional circuit, even in the steady state, wasteful current still flows. In addition, when the operational speed is high, the feed currents $i_1$ and $i_2$ have to be large. Consequently, the high-speed switching operation and the low power consumption are contradictory to each other.

It is an object of this invention to provide a type of driving circuit which provides both a low power consumption and a high operational speed.

SUMMARY OF THE INVENTION

A first driving circuit in accordance with the invention comprises a current source which outputs a first current and a second current which is proportional to the first current; a control circuit which starts the current source corresponding to a control signal, and controls the first current and the second current appropriately to ensure that the sum of the first current and the second current input to it is constant; and a switching element which is connected between an output terminal and a power source, and becomes conductive as the second current is input to a control terminal when the potential of the output terminal is lower than a prescribed potential.

A second driving circuit in accordance with the invention comprises a current source which outputs a current proportional to a reference current; a current feeding means which outputs a current smaller than the output current from the current source; a control means which starts the current source and the current feeding means corresponding to a control signal, and stops the current output from the current source when the potential at an output terminal is lower than a prescribed potential; and a switching element which is connected between the output terminal and ground, and corresponds to the current output from the current source and the current feeding means input to its control terminal.

A third driving circuit in accordance with the invention comprises a current source which outputs a first current and a second current which is proportional to the first current; a first control circuit which starts the first current source corresponding a control signal, and controls the first current and second current appropriately to ensure that the sum of the first current and the second current input to it is constant; a first switching element which is connected between an output terminal and a power source, and becomes conductive as the second current is input to a control terminal when the potential of the output terminal is lower than a first potential; a second current source which outputs the current proportional to a reference current; a second control means which starts the second current source corresponding to the control signal, and stops the current output of the second current source when the potential at the output terminal is lower than a second potential; and a second switching element which is connected between the output terminal and ground, and becomes conductive corresponding to the current output from the second current source and a current feeding means and input into the control terminal; corresponding to the control signal, the voltage level at the output terminal is set at the high level or low level.

The first driving circuit of this invention is a circuit which has an output terminal voltage level that is high. The second driving circuit of this invention is a circuit which has an output terminal voltage level that is low. The third driving circuit of this invention is a circuit which is a combination of the first driving circuit and the second driving circuit, with an output terminal voltage level that is high or low.

When the control signal requires a high voltage level, the first control circuit starts the first current source; when the potential at the output terminal is lower than the first potential, the second current is input to the control terminal of the first switching element, and only the first current is input to the first control circuit. In this case, the output terminal is connected to the power source through the first switching element. Consequently, the potential at the output terminal rises drastically. The potential at the output terminal becomes higher than the first potential, and the first switching element becomes nonconductive; the second current flows into the control terminal the first switching element. For the first control circuit, as the sum of the first current and second current input is kept constant, only the first current is input, the first and second currents are relatively large. When the first and second currents are input, the sum is equal to the first current when only the first current is input. Consequently, the first and second currents are relatively small.

On the other hand, when the control signal requires a low voltage level at the output terminal, the second control circuit starts the second current source and the current feeding means, and the second current source and current feeding means feed current to the control terminal of the second switching element. In this case, the output terminal is connected to ground through the second switching element. Consequently, the potential at the output terminal is rapidly decreased. As the potential at the output terminal becomes lower than the second potential, the second control circuit stops the current output of the second current source, while the current feeding means continues feeding current to the second switching element. Consequently, the second switching element remains in the conductive state. As the current output from the current feeding means is small, the current consumed by the second switching element is small after the second current source is turned off.

That is, in the driving circuit of this invention, a large current flows only in the transitional period when the voltage level is changed from the high level to the low level or vice versa. Otherwise, the voltage level at the output terminal becomes stable, and little current flows. Consequently, both high-speed operation and low power consumption can be realized.

Figure 1:
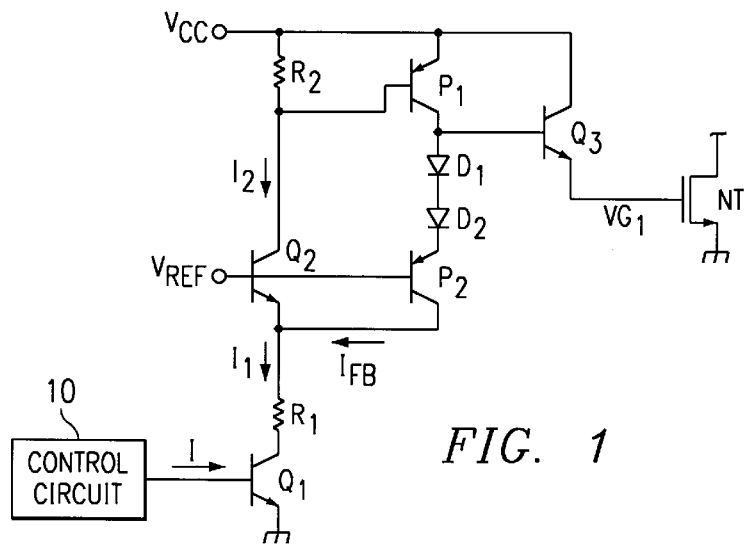
FIG. 1 is a circuit diagram illustrating a driving circuit (high-level feeding circuit) as a first embodiment of the invention.

Reference numerals and symbols as shown in the drawings:

10, control circuit
$Q_1$–$Q_3$, $Q_{11}$, $Q_{12A}$, $Q_{12B}$, $Q_{13}$–$Q_{15}$, npn transistor
$P_1$, $P_2$, pnp transistor
$D_1$, $D_2$, diode
$R_1$, $R_2$, $R_3$, $R_{11}$, $R_{12}$, resistor
$V_{cc}$, power source voltage
$V_{ref}$, reference voltage
NT, NMOS transistor used as switching element
$I_{BS}$, reference current source
$DS_{11}$, Schottky diode

DESCRIPTION OF PREFERRED EMBODIMENTS

FIG. 1 is a circuit diagram illustrating a first embodiment of a driving circuit in accordance with the invention. This circuit provides a high-level output.

In FIG. 1, 10 represents a control circuit, $Q_1$–$Q_3$ represent npn transistors, $P_1$ and $P_2$ represent pnp transistors, $D_1$ and $D_2$ represent diodes, $R_1$ and $R_2$ represent resistors, $V_{cc}$ represents the power source voltage, $V_{ref}$ represents the reference voltage, and NT represents an NMOS transistor used as the switching element.

In this circuit, the power source voltage $V_{cc}$ is higher than 2.5 V, and the reference voltage is set at 1.5 V.

The base of transistor $Q_1$ is connected to the output terminal of control circuit 10, its emitter is connected to ground, and its collector is connected to one end of resistor element $R_1$.

The other end of resistor element $R_1$ is connected to the emitter of transistor $Q_2$ and the collector of transistor $P_2$.

The base of transistor $Q_2$ and the base of transistor $P_2$ are connected to reference voltage $V_{ref}$. The collector of transistor $Q_2$ is connected through resistor element $R_2$ to power source voltage $V_{cc}$, and it is also connected to the base of transistor $P_1$.

The emitter of transistor $P_1$ is connected to power source voltage $V_{cc}$, and its collector is connected to the anode of diode $D_1$ and the base of transistor $Q_3$.

The cathode of diode $D_1$ is connected to the anode of diode $D_2$, and the cathode of diode $D_2$ is connected to the emitter of transistor $P_2$.

The collector of transistor $Q_3$ is connected to the power source voltage $V_{cc}$, and its emitter is connected as the output terminal of this circuit to the gate of NMOS transistor NT.

Among the aforementioned elements connected to each other, transistor $Q_1$ and resistor $R_1$ form a constant-current source; diodes $D_1$ and $D_2$ connected in series to each other form an output level adjusting circuit; and transistor $P_2$ forms a feedback circuit, while transistor $Q_3$ forms an output circuit. By changing the number of diodes that form the output level adjusting circuit, the output level can be changed.

In the following, the operation of the aforementioned configuration will be explained with reference to the waveform diagram shown in FIG. 2.

When the output is set on the high level, a high-level signal is output from control circuit 10, and current I is fed to the base of transistor $Q_1$, so that transistor $Q_1$ is turned on.

When transistor $Q_1$ is turned on, the base of transistor $Q_2$ is connected to reference voltage $V_{ref}$ (=1.5 V). Consequently, the voltage applied to resistor $R_1$ becomes constant, and a constant current $I_1$ flows through resistor $R_1$.

In this case, when output terminal level $VG_1$ of this circuit is lower than the preset first level $V_1$ ($V_1 > VG_1$), the collector current $I_2$ of transistor $Q_2$ becomes $I_2 = I_1$.

Figure 2:
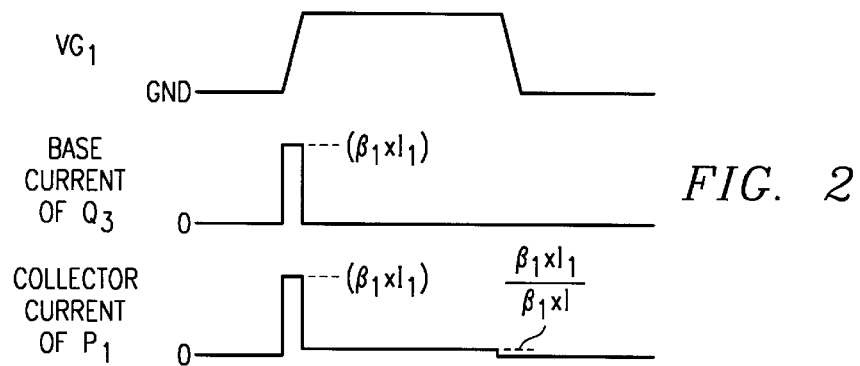
FIG. 2 is a diagram illustrating the operational waveforms the main portion of the circuit shown in FIG. 1.

Here, as the resistance of resistor $R_2$ is very large, the current flowing through resistor $R_2$ can be neglected; suppose the HFE value of transistor $P_1$ is $\beta_1$, as shown in FIG. 2, the current ($\beta_1 \times I_2$) is fed to the base of transistor $Q_3$.

As a result, output terminal level $VG_1$ rises rapidly.

When output terminal level $VG_1$ reaches a prescribed voltage, that is, when it becomes the first level $V_1$ (or higher), feeding of current to the base of transistor $Q_3$ is stopped, and current ($\beta_1 \times I_2$) flows in diodes $D_1$ and $D_2$, and transistor $P_2$.

This current ($\beta_1 \times I_2$) then flows through the collector of transistor $P_2$, and it then flows as feedback current $I_{FB}$ to the constant-current source made of transistor $Q_1$ and resistor $R_1$.

As transistor $Q_1$ and resistor $R_1$ form a constant-voltage source, when the HFE values of transistors $Q_2$ and $P_2$ are high enough and the base current of transistors $Q_2$ and $P_2$ can be neglected, the emitter current of transistor $Q_2$ due to the feedback current $I_{FB}$ changes as $I_1 \rightarrow (I_1/(\beta_1+1))$.

As shown in FIG. 2, the collector power source current of transistor $P_1$ changes as $(\beta_1 \times I_1) \rightarrow ((\beta_1 \times I_1)/(\beta_1+1))$.

Consequently, as shown in following formula (1), in this circuit, it is possible to reduce the power source current by $(\beta_1 \times I_1)$ for the steady state as compared with the transition state, while the high speed of operation is maintained for this circuit.

$$I_1 + (\beta_1 \times I_1) - I_1 = \beta_1 \times I_1 \quad (1)$$

As explained above, in this embodiment, in a circuit in which high level is fed to the gate of NMOS transistor NT, transistor $Q_1$ and resistor $R_1$ form a constant-current source; the current is amplified by the constant-current source and is fed by transistor $P_1$ to the base of output transistor $Q_3$; after the output level of output transistor $Q_3$ exceeds the first level $V_1$, the current fed to the base of output transistor $Q_3$ is fed back to the constantcurrent source, and the collector current of transistor $P_1$ is decreased. Consequently, the power consumption can be cut, and a high speed of operation can be realized.

Figure 3:
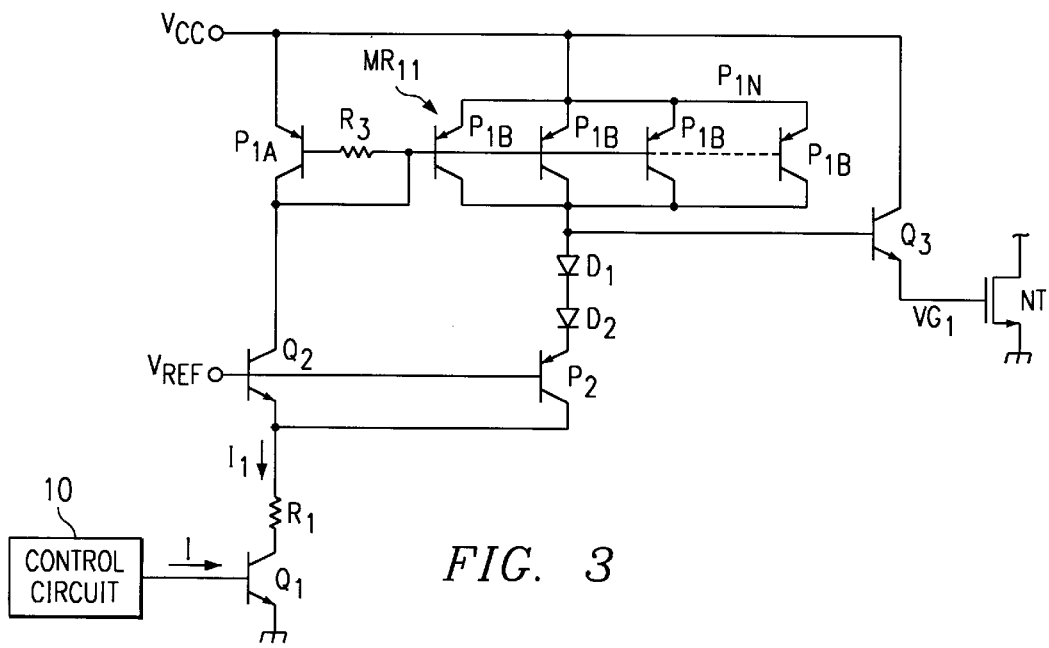
FIG. 3 is a circuit diagram illustrating a driving circuit (high-level feeding circuit) as a second embodiment of the invention.

FIG. 3 is a circuit diagram illustrating a second embodiment of a driving circuit in accordance with the invention. This circuit also feeds high-level output.

This embodiment differs from the first embodiment in that the base current feeding circuit of output transistor $Q_3$ in this circuit is made of a current mirror circuit $MR_1$ comprising a number of pnp transistors.

As shown in FIG. 3, current mirror circuit $MR_1$ comprises pnp transistors $P_{1A}$ and $P_{1N}$, and resistor $R_3$.

pnp transistor $P_{1N}$ is made of N pnp transistors $P_{1B}$, with their bases, emitters, and collectors connected to each other, respectively.

The emitter of transistor P1A is connected to power source voltage $V_{cc}$, its collector is connected to the collector of transistor $Q_2$, and its base is connected through resistor $R_3$ to the collector and the bases of N transistors $P_{1B}$.

For the N transistors $P_{1B}$, the midpoint of emitters connected to each other is connected to power source voltage $V_{cc}$, and the midpoint of collectors connected to each other is connected to the anode of diode $D_1$ and the base of output transistor $Q_3$.

In this circuit, when transistor $Q_1$ is turned on by control circuit 10, the current fed to the base of output transistor $Q_3$ becomes (N×$I_1$), where $I_1$ is the current flowing in the constant-current source made of transistor $Q_1$ and resistor $R_1$, when the HFE values of transistors $P_{1A}$ and $P_{1N}$ are large enough and the base currents of the two transistors can be neglected.

Here when output terminal level $VG_1$ exceeds the first level $V_1$, the current of (N×$I_1$) flows as feedback current $I_{FB}$ through diodes $D_1$ and $D_2$ and transistor $P_2$ into the constant-current source.

In this case, due to feedback current $I_{FB}$, the emitter current of transistor $Q_2$ changes as $I_1 \rightarrow I_1/(N+1)$.

Also, the collector current of transistor $P_{1N}$ changes as (N×$I_1$) $\rightarrow$ (N×$I_1$)/(N+1).

Consequently, in this circuit, it is possible to reduce the power source current by (N×$I_1$) in the steady state as compared with the transition state, while the high speed of operation can be maintained.

As explained above, in this second embodiment, too, although the circuit area is significantly increased, the same effect as that in the first embodiment can still be achieved. That is, the power consumption can be reduced while the high speed of operation can be maintained.

Figure 4:
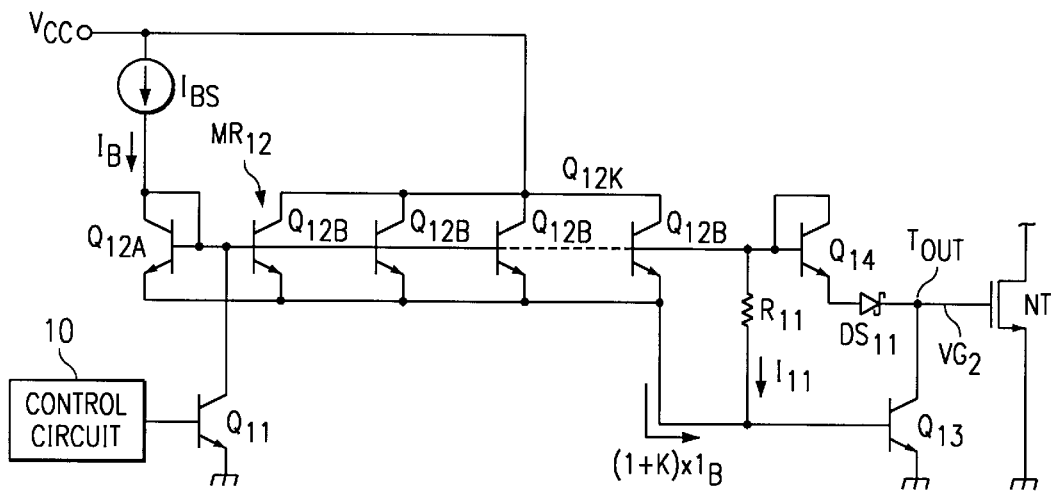
FIG. 4 is a circuit diagram illustrating a driving circuit (low-level feeding circuit) as a third embodiment of the invention.

FIG. 4 is a circuit diagram illustrating a third embodiment of a driving circuit in accordance with the invention. This circuit feeds a low-level output.

In FIG. 4, 10 represents a control circuit; $Q_{11}$, $Q_{12A}$, $Q_{12B}$, $Q_{13}$, and $Q_{14}$ represent npn transistors; $MR_{12}$ represents current mirror circuit; $I_{BS}$ represents a reference current source; $R_{11}$ represents a resistor; $DS_{11}$ represents a Schottky diode; and NT represents an NMOS transistor.

Current mirror circuit $MR_{12}$ is made of npn transistors $Q_{12A}$ and $Q_{12K}$.

npn transistor $Q_{12K}$ is made of K npn transistors $Q_{12B}$, with their bases, emitters, and collectors connected to each other, respectively. The base of transistor $Q_{12A}$ is connected to the base of K transistors $Q_{12B}$.

The base of transistor $Q_{11}$ is connected to the output terminal of control circuit 10. The emitter is connected to ground, and the collector is connected to the midpoint of the connection between transistor $Q_{12A}$ and $Q_{12K}$ of the current mirror circuit $MR_{12}$.

The emitter of transistor $Q_{12A}$ of current mirror circuit $MR_{12}$ is connected to the connection midpoint among the emitters of K transistors $Q_{12B}$, and the midpoint of the connection of these emitters is connected to the base of transistor $Q_{13}$. The base and collector of transistor $Q_{12A}$ are connected to each other, and the connection midpoint is connected through a reference current source $I_{BS}$ to power source voltage $V_{cc}$.

In addition, the midpoint of the connection among the collectors of K transistors $Q_{12B}$ is connected to power source voltage $V_{cc}$.

For each transistor $Q_{12B}$, the base is connected to the base and collector of transistor $Q_{11}$, and it is connected through resistor $R_{11}$ to the base of transistor $Q_{13}$.

The emitter of transistor $Q_{13}$ is connected to ground, and its collector is connected to output terminal $T_{out}$ of this circuit. The output terminal $T_{out}$ is connected to the gate of NMOS transistor NT.

The emitter of transistor $Q_{14}$ is connected to the anode of Schottky diode $DS_{11}$, and the cathode of Schottky diode $DS_{11}$ is connected to output terminal $T_{out}$.

Among the elements connected to each other, current mirror circuit $MR_{12}$ and reference current source $I_{BS}$ form a second constant-current source; transistor $Q_{13}$ forms a level lowering circuit; transistor $Q_{14}$ and Schottky diode $DS_{11}$ form a low-level detection/retention circuit; and resistor $R_{11}$ forms a minute current feeding circuit.

Figure 5:
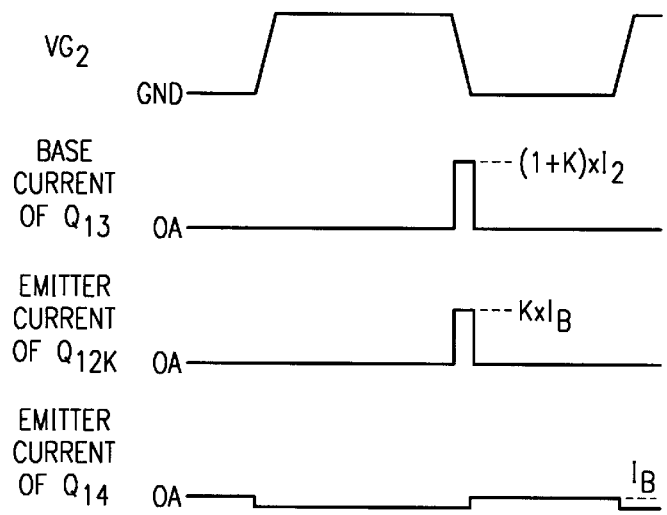
FIG. 5 is a diagram illustrating the operational waveforms of the circuit shown in FIG. 4.

In the following, the operation of the aforementioned configuration will be explained with reference to the waveform shown in FIG. 5.

When output terminal $T_{out}$ is set at the low level, the output of control circuit 10 is set at the low level, and no current is fed to the base of transistor $Q_{11}$. As a result, transistor $Q_{11}$ is turned off.

In this case, when output terminal level $VG_2$ exceeds the second level $V_2$, for example, about 0.2 V, the forward voltage $V_F$=0.7 V of transistor $Q_{14}$ at room temperature and the forward voltage $V_F$=0.5 V of Schottky diode $DS_{11}$ are added, and a voltage about 1.2 V or lower is applied between the output terminal $T_{out}$ and the base of transistor $Q_{14}$. Consequently, reference current $I_B$ due to reference current source $I_{BS}$ does not flow from the base of transistor $Q_{12B}$ of current mirror circuit $MR_{12}$ to the base of transistor $Q_{14}$.

When the base currents of transistors $Q_{12A}$ and $Q_{12K}$ and the current flowing through high resistor $R_{11}$ are ignored, as the ratio of size of the emitter of transistor $Q_{12A}$ to the emitter of transistor $Q_{12K}$ is 1:K, reference current $I_B$ from reference current source $I_{BS}$ is increased to (1+K) times, and the current of $((1+K) \times I_B)$ flows to the base of transistor $Q_{13}$.

As a result, transistor $Q_{13}$ is turned on, and output terminal $T_{out}$ is connected to ground so that output terminal level $VG_2$ drops rapidly to below 0.2 V.

As output terminal level $VG_2$ drops to a level below 0.2 V, reference current $I_B$ flows from reference current source $I_{BS}$ to output terminal $T_{out}$ through transistor $Q_{14}$ and Schottky diode $DS_{11}$, and transistors $Q_{12A}$ and $Q_{12K}$ of current mirror circuit $MR_{11}$ are turned off.

Consequently, feeding of current to the base of transistor $Q_{12}$, $((1+K) \times I_B)$, is stopped.

However, in this case, microampere current $I_{11}$ through high resistor $R_{11}$ is fed to the base of transistor $Q_{13}$, and output terminal level $VG_2$ is maintained stably on the low level.

That is, in this circuit, when the current flowing in high resistor $R_{11}$ is ignored, in the varying-output transition state, a current of $((1+K) \times I_B)$ flows to the base of output transistor $Q_{13}$, and, as the output terminal level $VG_2$ drops below about 0.2 V, the power source current changes as $((1+K) \times I_B) \rightarrow I_B$.

Consequently, in this circuit, while the high-speed operation can be maintained, the power source current in the steady state can be cut by $(K \times I_B)$ as compared with that in the transition state.

As explained in the above, in this third embodiment, too, just as in the first and second embodiments, both low power consumption and high operational speed can be realized at the same time.

Figure 6:
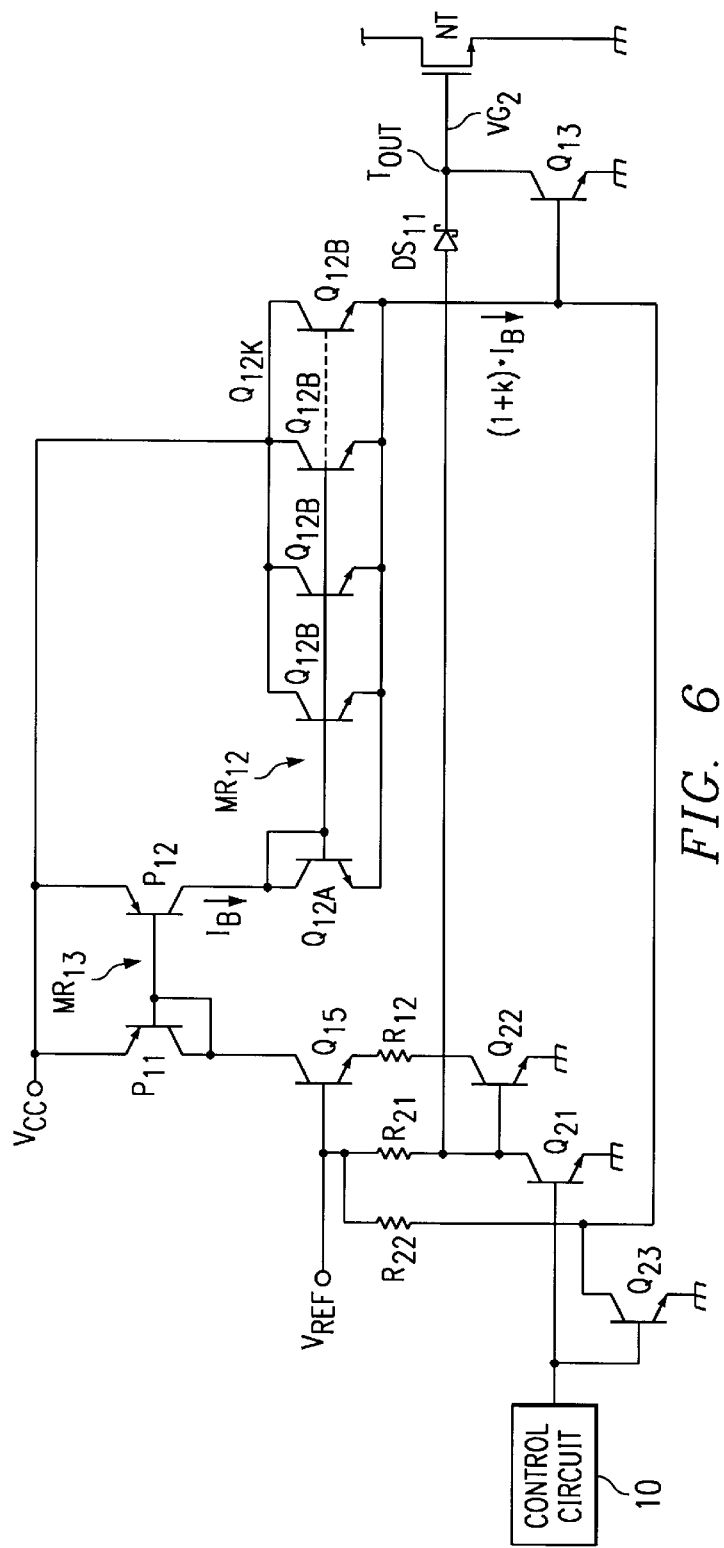
FIG. 6 is a circuit diagram illustrating a driving circuit (low-level feeding circuit) as a fourth embodiment of the invention.
Figure 9:
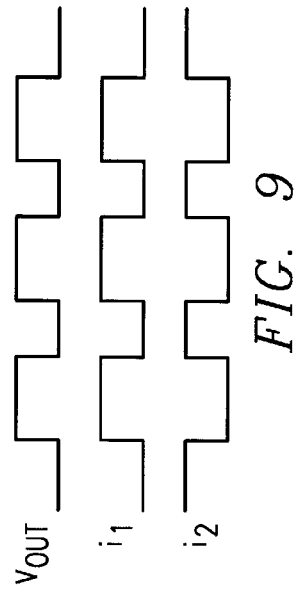
FIG. 9 is a diagram illustrating the driving waveform and output waveform of the circuit shown in FIG. 8.

FIG. 6 is a circuit diagram illustrating a fourth embodiment of a driving circuit in accordance with the invention. This circuit feeds a low-level output.

This embodiment differs from the third embodiment with the following additional features. Constant-current source $I_{BS}$ is made of current mirror circuit $MR_{13}$ as well as transistor $Q_{15}$ and resistor $R_{12}$. For control of the operation of the circuit, transistor $Q_{11}$ is replaced by transistors $Q_{21}$, $Q_{22}$, and $Q_{23}$ and resistors $R_{21}$ and $R_{22}$. Transistors $Q_{14}$ and resistor $R_{11}$ are deleted. Also, the anode of Schottky diode $DS_{11}$ is connected to the base of transistor $Q_{22}$, and the base of transistor $Q_{13}$ is connected to the collector of transistor $Q_{23}$.

In this circuit, when the output of control circuit 10 is on the high level, transistors $Q_{21}$ and $Q_{23}$ are turned on, and transistors $Q_{22}$ and $Q_{13}$ are turned off. In this case, as transistor $Q_{22}$ is turned off, no current flows in transistor $Q_{13}$, and current mirror circuits $MR_{13}$ and $MR_{12}$ do not operate.

Here, when the output of control circuit 10 is changed to the low level, transistors $Q_{21}$ and $Q_{23}$ are turned off, and transistors $Q_{22}$ and $Q_{13}$ are turned on. As a result, current mirror circuits $MR_{13}$ and $MR_{12}$ operate, and a current is fed to the base of transistor $Q_{13}$. Consequently, a current flows rapidly from output terminal $T_{out}$ of transistor $Q_{13}$ to ground, and output terminal level $VG_2$ is rapidly changed from the high level to the low level.

As diode $DS_{11}$ is connected between the base of transistor $Q_{22}$ and output terminal $T_{out}$, as the output terminal level $VG_2$ drops, the base potential of transistor $Q_{22}$ also drops. When the output terminal level $VG_2$ drops to below 0.2 V, transistor $Q_{22}$ is turned off, no current flows in current mirror circuits $MR_{13}$ and $MR_{12}$. In this case, as a minute current is still fed from high resistor $R_{22}$ to the base of transistor $Q_{13}$, transistor $Q_{13}$ remains on, and output terminal $T_{out}$ is also kept on the low-level steady state.

As explained above, in the fourth embodiment, the same effects as those in the third embodiment can also be realized.

Figure 7:
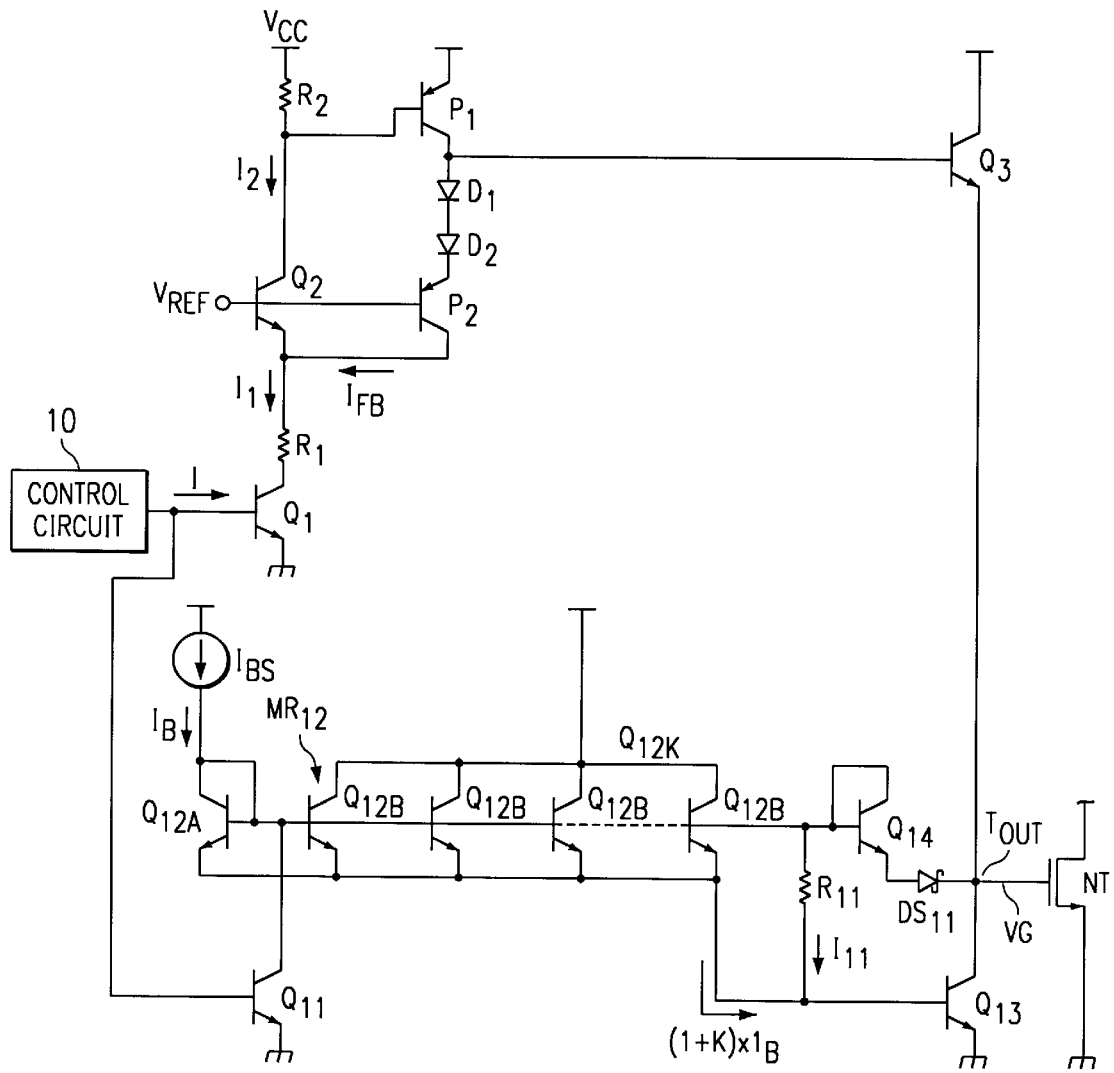
FIG. 7 is a circuit diagram illustrating a driving circuit (high/low-level feeding circuit) as a fifth embodiment of the invention.
Figure 8:
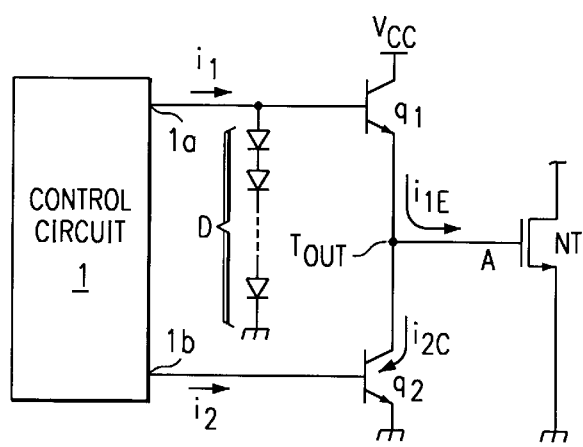
FIG. 8 is a circuit diagram illustrating an example of a conventional driving circuit.

FIG. 7 is a circuit diagram illustrating a fifth embodiment of a driving circuit in accordance with the invention. This circuit is a combination of the high-level feeding circuit shown in FIG. 1 and the low-level feeding circuit shown in FIG. 4, and it feeds both the high-level output and the low-level output.

In this circuit, the output of control circuit 10 is connected to the base of transistor $Q_1$ of the high-level feeding circuit and the base of transistor $Q_{11}$ of the low-level feeding circuit. In addition, the connection midpoint of the emitter of transistor $Q_3$ in the high-level feeding circuit, the collector of transistor $Q_{13}$ of the low-level feeding circuit, and the cathode of Schottky diode $DS_{11}$ are connected via the output terminal $T_{out}$ to the gate of NMOS transistor NT.

In this circuit, corresponding to the output level of control circuit 10, the current source of the high-level feeding circuit and the current source of the low-level feeding source operate complementary to each other to obtain the high-level output and low-level output.

In each circuit, the operation is performed in the same way as above, and the scheme is very effective for use in a switching regulator and other switching circuits requiring a low power consumption and high operational speed.

That is, as most of the power consumed in a switching regulator controller is consumed in the output stage, a decrease in the current of the output stage can significantly improve the efficiency of the switching regulator.

Also, in the aforementioned embodiments, n-channel MOS transistors are presented as examples of the switching elements. However, it should be understood that p-channel MOS transistors, bipolar transistors, etc., can also be used in this invention.

As explained above, according to this invention, a relatively simple driving circuit can be used to realize high-speed operation with a lower power consumption.

In particular, the driving circuit is appropriate for a switching regulator controller, since most of the power consumed in it takes place at the output stage. Therefore, a decrease in the current in the output stage can significantly improve the efficiency of the switching regulator.

I claim:

1. A low power, high speed driving circuit comprising:

a power terminal for connection to a power voltage source;

a current source for providing a current output as a current proportional to a reference current;

current feeding means for providing a current smaller than the output current from said current source;

a control circuit operably connected to said current source and to said current feeding means and generating a control signal applied to said current source;

said current source and said current feeding means being initiated in response to the control signal from said control circuit being applied to said current source;

a switching element having input, output and control terminals;

a driving circuit output terminal connected to the input terminal of said switching element, the output terminal of said switching element being connected to ground;

said switching element becoming conductive in response to the input of current from said current source and the current from said current feeding means to the control terminal thereof; and said control circuit stopping the current output from said current source when the potential of said driving circuit output terminal is higher than a predetermined output potential threshold thereof.

2. A driving circuit as set forth in claim 1, further including a plurality of transistors having respective input, output and control terminals and being connected in parallel with respect to each other to define a current mirror circuit;

the midpoint of the output terminals of the plurality of transistors included in said current mirror circuit being connected to the control terminal of said switching element and the midpoint of the input terminals of said plurality of transistors included in said current mirror circuit being connected to said power terminal.

* * * * *